United States Patent
Archibald

(10) Patent No.: US 8,331,573 B2
(45) Date of Patent: Dec. 11, 2012

(54) APPLAUSE ATTENUATION SYSTEM

(75) Inventor: James L. Archibald, Lehigh, PA (US)

(73) Assignee: Agere Systems LLC, Allentown, PA (US)

( * ) Notice: Subject to any disclaimer, the term of this patent is extended or adjusted under 35 U.S.C. 154(b) by 1456 days.

(21) Appl. No.: 11/872,838

(22) Filed: Oct. 16, 2007

(65) Prior Publication Data

US 2009/0097664 A1  Apr. 16, 2009

(51) Int. Cl.
*H04R 29/00* (2006.01)
*H04B 15/00* (2006.01)
*H03G 3/00* (2006.01)

(52) U.S. Cl. .......................... 381/56; 381/94.1; 381/107

(58) Field of Classification Search .................... 381/56, 381/94.6, 106, 107, 1, 2–4, 13, 73.1, 94.1–94.3; 455/3.02

See application file for complete search history.

(56) References Cited

U.S. PATENT DOCUMENTS

| | | | | |
|---|---|---|---|---|
| 5,524,060 | A  * | 6/1996 | Silfvast et al. | 381/104 |
| 2005/0086058 | A1* | 4/2005 | Lemelson et al. | 704/270 |
| 2005/0251273 | A1* | 11/2005 | Bychowsky et al. | 700/94 |
| 2007/0103355 | A1* | 5/2007 | Yamada | 341/155 |

OTHER PUBLICATIONS

Hu et al., "Audio Hot Spotting and Retrieval Using Multiple Audio Features and Multiple ASR Engines", 6 pages.
Olajec et al., "GA-Based Feature Extraction for Clapping Sound Detection", 8th Seminar on Neural Network Applications in Electrical Engineering, NEUREL-2006, 5 pages.

* cited by examiner

*Primary Examiner* — Vivian Chin
*Assistant Examiner* — Douglas Suthers
(74) *Attorney, Agent, or Firm* — Mendelsohn, Drucker & Associates, P.C.; Edward J. Meisarosh; Steven Mendelsohn

(57) ABSTRACT

A method and apparatus for attenuating applause from a satellite radio signal, including, a spectrum analyzer and comparator having an internal memory for obtaining a spectral signature of different sounds in the radio signal, a detector automatically detecting whether the sounds contain applause, an attenuator attenuating the sounds containing applause; and a digital to analog converter converting the attenuated sounds for audio listening. A comparator compares applause in the radio signal to a threshold level and disables the attenuator when the applause abates below the threshold level.

20 Claims, 3 Drawing Sheets

APPLAUSE ATTENUATION SYSTEM

FIELD OF THE INVENTION

The invention relates to a system and a method of receiving and playing a satellite radio signal in a receiver equipped with applause attenuation.

BACKGROUND

The Satellite Digital Audio Radio System (SDARS) provides satellite antennae and terrestrial repeaters to transmit digital data frames of audio data over the air, and in the form of radio programs for listening by consumers. SDARS data frames are comprised of encoded (i.e. compressed) digital audio data that form into digital audio streams. The encoded audio streams are grouped with one another in data clusters, encoded with an error protection protocol, modulated to channels having appropriate carrier band frequencies and broadcast over the air for listening via channel tunable receivers.

An SDARS compatible radio receiver receives the satellite signal transmission, which is demodulated according to a channel selection that is made by the consumer at the receiver to decode a corresponding digital audio stream for listening. Two types of audio encoding are used.

A system of variable bit rate audio encoding for high quality music reproduction includes but is not limited to Perceptual Audio Coder (PAC), MP3, WMA or AAC. In the system audio compression algorithms are processed to attain high quality audio reproduction.

A system of fixed-bit-rate audio encoding is primarily suitable for audio reproduction of talk radio broadcasts, in which music reproduction is of low quality and of secondary importance. Such a system includes but is not limited to Multimode Transform Predictive Coder (MTPC), G.726, G.729, GH.723, GSM-HR, GSM-EFR or GSM-FR.

SDARS compatible radio receivers are especially suitable for use in vehicles, which travel beyond the effective range of terrestrial radio broadcasts. In vehicles, the listeners of talk radio satellite broadcasts may adjust their radio volume controls with reasonably high audio gain to enable understanding of spoken words over vehicular traffic noise and other environmental noise. When radio audience applause is reproduced at such reasonably high audio gain, the listeners are often compelled to manually turn down the radio volume controls until loud applause abates, and the quieter spoken words resume. Making such adjustments of volume controls distracts attention from the task of driving the vehicles.

SUMMARY OF THE INVENTION

One embodiment of the invention provides a method of receiving and playing a satellite radio signal with a listening volume by automatically detecting whether the satellite radio signal contains data representing applause and automatically attenuating the volume gain during an interval of time while the satellite radio signal contains data representing applause.

One embodiment of the invention provides a satellite radio apparatus comprising a satellite radio receiver for receiving and demodulating a satellite radio signal, an amplifier for supplying volume gain to digitally represented sounds in the demodulated satellite radio signal, and a processor, the processor automatically detecting whether the sounds contain applause, and the processor automatically attenuating the volume gain during an interval of time while the demodulated sounds contain applause.

One embodiment of the invention provides a system for volume gain compression of satellite radio transmissions of audio programs by application of a mathematical algorithm for applause recognition and automatic attenuation of the applause present in satellite radio transmissions.

An embodiment of the invention adapts the system to select from a number of different mathematical algorithms for use in the system.

BRIEF DESCRIPTION OF THE DRAWINGS

Embodiments of the invention will now be described by way of example with reference to the accompanying drawings.

DETAILED DESCRIPTION

Some satellite radio channels are dedicated to transmit audio programs such as recorded music without audience applause, while others are dedicated to transmit speech content programs involving talk, and performances such as comedy or drama, which are interjected with applause. Depending upon the decibel environment of the listener and the gain of the applause relative to the audio program being transmitted, the applause can be annoyingly loud and even startling or painful, which causes the listener to reach for a volume control at the radio receiver to reduce the play volume until the applause subsides. The listener must then manipulate the volume control to increase the audio volume to restore the listening volume of the quieter audio program. The attentiveness required of the listener to repeatedly adjust the volume control is distracting and may be hazardous while the listener is driving a vehicle.

To reduce the bit-rate required for processing signals, one embodiment of the invention enables the applause squelch processing for lower bit-rate, or fixed bit-rate, encoded transmissions (i.e. MPTC), and disables the applause squelch processing upon detection of high bit-rate, or variable bit-rate, encoded transmissions (i.e. PAC). According to an embodiment of the invention, the applause squelch processing is disabled upon a listener tuning the receiver to a channel dedicated to a high bit-rate, or variable bit-rate, encoded transmission. An embodiment of the invention automatically recognizes a selected radio channel at the receiver according to its dedication to transmit audio programs of a type likely to contain applause, and automatically performs real time audio signal analysis on sampled data to recognize the presence of applause data. According to another embodiment of the invention, the applause squelch processing is enabled for a channel dedicated to a high bit-rate, or variable bit-rate, encoded transmission. The invention reduces the audio gain of the transmitted signal for a time duration while the sampled data represents applause, and thereafter increases the gain in the absence of the applause. As a result, the received signal undergoes gain compression at the receiver, which attenuates the applause data present in the transmitted signal.

Figure 1:
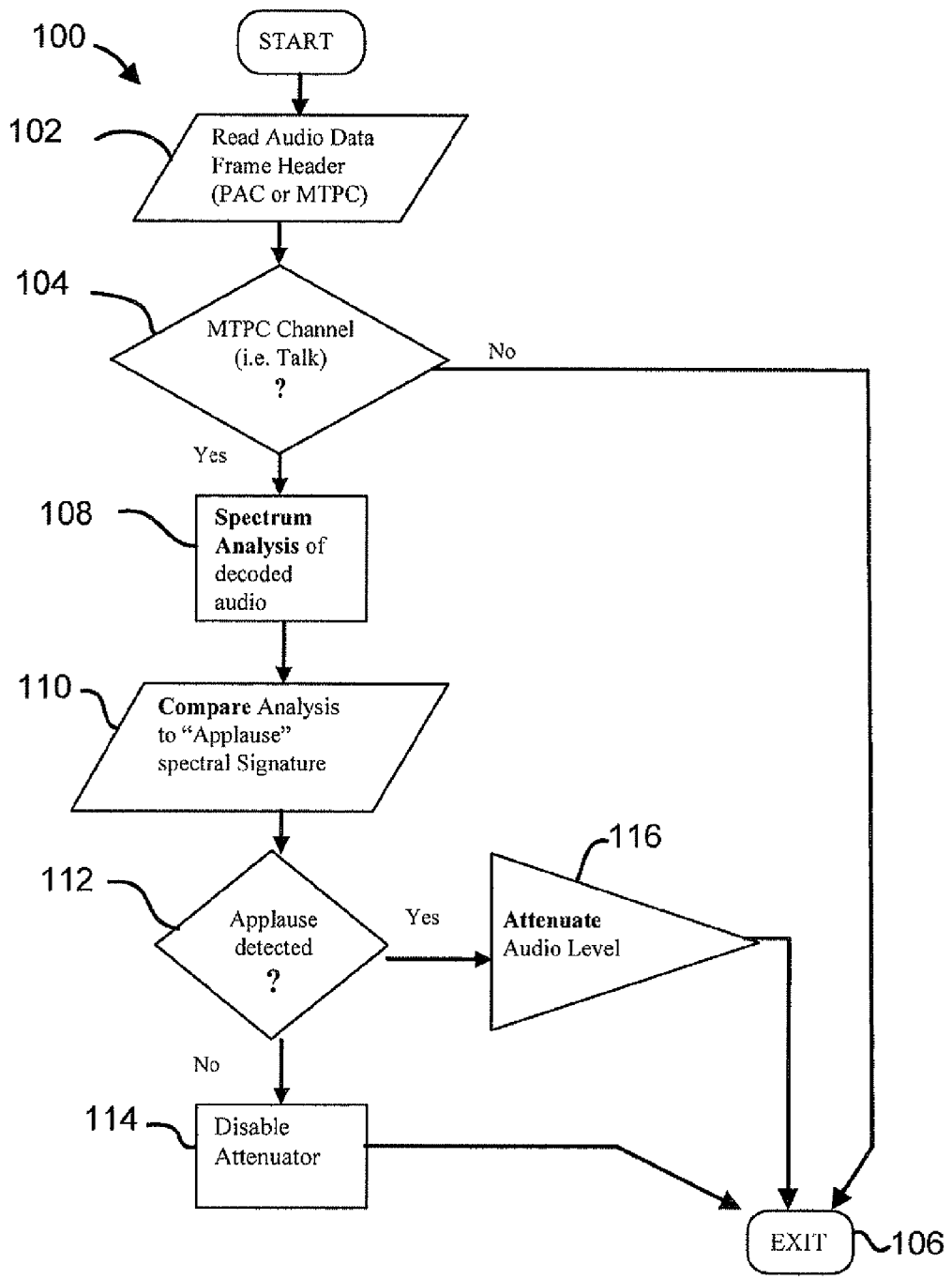
FIG. 1 is a diagram of a system according to one embodiment of the invention.

With reference to FIG. 1, a process 100 is disclosed. Assuming an applause squelch is enabled, at 102 the receiver scans and reads the audio data frame header for an MPTC or PAC encoding embedded in a Frame Sync Pattern of the header.

At 104, while "yes" is the result of reading the audio data frame header, the channel is encoded to reduce band width, by an MTPC coder, or alternatively, by a speech coder, including but not limited to G.726, G.729, GH.723, GSM-HR, GSM-EFR or GSM-FR, then the channel is dedicated to speech content programs. Moreover, applause is likely to occur. Alternatively, if "No" is the result of reading the audio data frame header, the applause squelch is less likely to be desired for a PAC encoded transmissions, since applause is likely not to be present. Moreover, the compression resulting from processing the applause squelch would lower the audio fidelity of a music program. Decoding a PAC encoded transmission, then processing for applause squelch, runs at a higher bit-rate, which requires more DSP processing compared to MPTC frames. At 108, assuming an applause squelch is enabled, an applause attenuator algorithm according to the invention scans the audio data frame of the audio transmission channel selected at the listener's receiver or radio. According to another embodiment of the invention, the applause squelch processing can be enabled for a channel dedicated to a high bit-rate, or variable bit-rate, encoded transmission. Thereby, the process disclosed by FIG. 1 is altered by eliminating the process steps 102 and 104, and directly enabling the applause squelch at process step 108.

Spectral analysis of the radio signal is performed by running mathematical algorithms applied on sampled data representing the radio signal, for obtaining the spectrum of different sounds of the radio signal. A spectrum representing applause is obtained and classified as an applause spectrum, such that the applause is classified and segmented relative to spectrums of other audio classifications present in the radio signal. The applause attenuator algorithm scans the header of the audio data frame to determine that the channel is dedicated to an MPTC encoder. Spectral analysis is performed continuously on buffered samples of the received channel transmissions for detection of applause spectrum. Systems and methods for obtaining spectral signatures of different sounds present in the satellite radio signal, and obtaining a classification of an applause spectrum include, but are not limited to classification algorithms, features definition algorithms and genetic algorithms, which are performed on moving window, buffered samples of the received audio transmission. A classification algorithm includes, but is not limited to a Fast Fourier Transform (FFT), Hidden Markov Model (HMM) or a correlation detection algorithm. Feature definition algorithms include a plurality of applause characteristic features in a broad spectral content (white noise spectrum) separately categorized relative to a plurality of voice characteristic features in a narrow frequency spread content (voice inflections and pitch correlated frequencies), and the time durations of such features. The spectral signatures of the different sounds of the sampled data representing the satellite radio signal are obtained and classified, and at 110 are compared to the predetermined spectral signature of applause.

At 112 when a detector senses the presence of applause content in the received signal transmission, the audio level is attenuated at 116. The audio signal is squelched by a number of dBs (decibels). The number of dBs is preset when determined by experimentation. Alternatively, the receiver is equipped with a manually operated, "applause" dedicated gain adjustment (control knob) to set the number of dBs at which the squelched applause content is attenuated. At 114, when the detector senses that the applause content has abated below a threshold dB level for that content, or is no longer present, the attenuation is removed from the gain of the received signal. The feature of a threshold dB level requires a comparator to compare the sampled signal to the threshold dB level stored in a memory, and to remove the attenuation when the applause dB content has abated at least to the threshold dB level. Exit 106 signifies the end of the process when an attenuator is disabled at 114 or when a detector reads a PAC frame header at 102.

Figure 2:
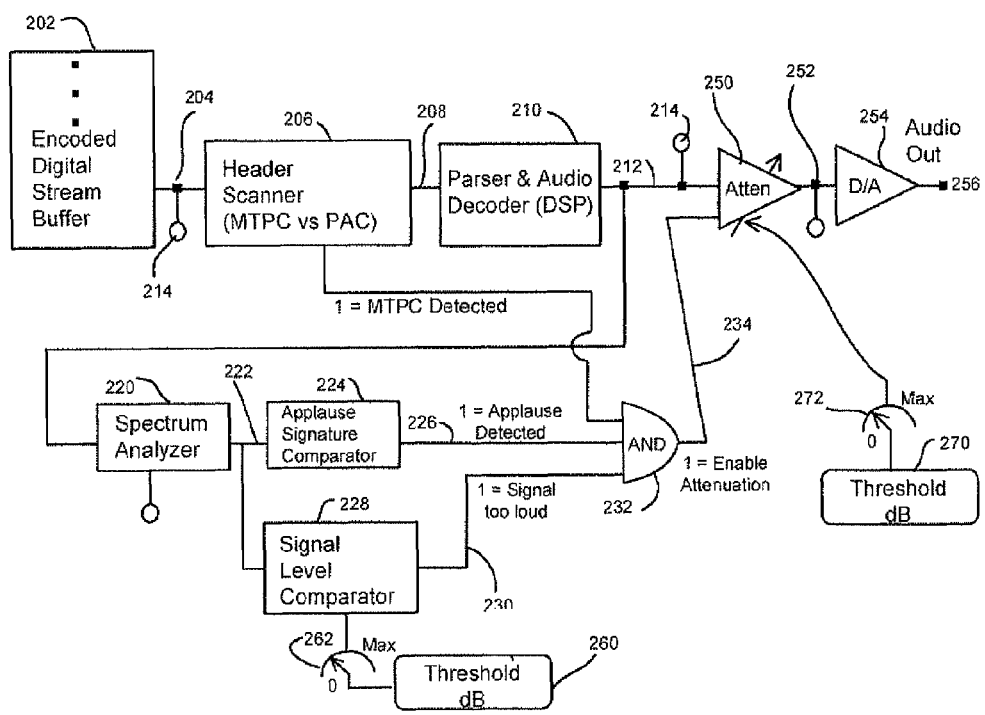
FIG. 2 is a diagram of structural elements of the system according to FIG. 1.

FIG. 2 discloses a digital microprocessor apparatus 200 in the form of an applause attenuation system for mounting in a satellite radio receiver.

The elements of the apparatus 200 will now be described. An encoded digital stream buffer or data buffer 202 stores incoming buffered samples of a digital satellite radio signal transmitted over the air. The buffered sample of the digital radio signal is output at 204, and is processed by a header scanner 206 to detect if the incoming coded signal contains an MTPC data frame header. The coded signal passes through the header scanner 206 and is output at 208 to a parser and audio decoder block 210, for example, a DSP. The parser removes framing and other overhead bits from the data stream in preparation for the decoder to decompress the encoded PAC or MTPC signal into an uncompressed digital audio stream. The uncompressed digital audio stream 212 is routed to two blocks: to the attenuator 250 and also to a spectrum analyzer 220.

The header scanner block 206 outputs a logical "1" if the data frame currently being processed is an MTPC frame. If it is a PAC or some other type of non-speech data frame then the header scanner 206 outputs a logical "0" to an input of a three-input AND gate 232.

The spectrum analyzer 220, the applause detector 224 and the signal level comparator 228 use various mathematical algorithms for applause recognition. Spectral analysis is performed on the digital radio signal by such techniques as correlation detection algorithm or a fast Fourier transform (FFT) on moving windows of digital samples of recorded data, such that the applause is classified and segmented relative to other audio classifications present in the received radio transmission. Further, such mathematical algorithms are useful in the present invention for encoding (i.e. compression) digital audio data in the received radio transmission. The algorithms and the comparator data are internally stored in an internal memory of the spectrum analyzer 220, applause signature comparator 224 and the signal level comparator 228.

The output 222 of the spectrum analyzer 220 is routed to two blocks: the applause signature comparator 224 and the signal level comparator 228. The applause signature comparator 224 compares the spectral signature of the incoming signal to a known signature of applause. If the signal meets the criteria then the applause detector outputs at 226 a digital "1" to one of the three inputs of the AND gate 232.

The output of the spectrum analyzer 220 is also routed to the input of the signal level comparator 228. The amplitude of the audio signal is compared against a preset gain threshold 262. The threshold 262 is stored in a register 260 that can be changed by system firmware. If the received audio signal exceeds the gain threshold 262 then the signal level comparator 228 outputs at 230 a digital "1" to signal 230, and this is used as another input by the AND gate 232.

AND gate 232 outputs a logical "1" at 234, thereby enabling the applause attenuator 250, only in the case when all of the following three conditions hold true: (a) the signal is an MTPC data frame as determined by the header scanner 206, (b) the applause signature comparator 224 has determined the signature of applause to be present and (c) the signal level comparator 228 has registered that the overall level of the applause exceeded the allowable threshold level 262. If these three conditions exist then the attenuator 250 is enabled and the applause is thereby squelched prior to being output at 252 to the digital-to-analog (D/A) converter 254.

The D/A is used for conversion of the digital radio signal to an analog radio signal that has the amplitude reduced when applause is detected. From the D/A converter 254, the analog radio signal is adapted for listening by using the radio receiver, and is supplied to an output terminal 256 for connection to the radio receiver.

The applause attenuator 250 squelches the compared radio signal (audio signal) by a number of dBs (decibels). The number of dBs may be preset as determined by experimentation. Alternatively, an adjustable switch 272 equips the receiver with a manually operated, applause gain adjustment, to adjust the threshold dB level from zero to max (maximum) by adding or subtracting various threshold dB values stored in the memory 270. Thereby, the threshold dBs are set, according to which the dB squelch amount is determined and applied to the applause content.

When the detector senses that the applause content has abated below a threshold dB level, or is no longer present, the variable attenuator 250 is set for 0 dB of attenuation. Hence the squelching is removed and the audio proceeds at the normal volume level.

The apparatus disclosed by FIG. 2 comprises structural elements manufactured as discrete blocks, or alternatively manufactured as an integrated digital signal processor (DSP) on a chip or other semiconductor manufactured processor inserted at interface connection points 214 located between the buffer 202 and the attenuator 250.

Figure 3:
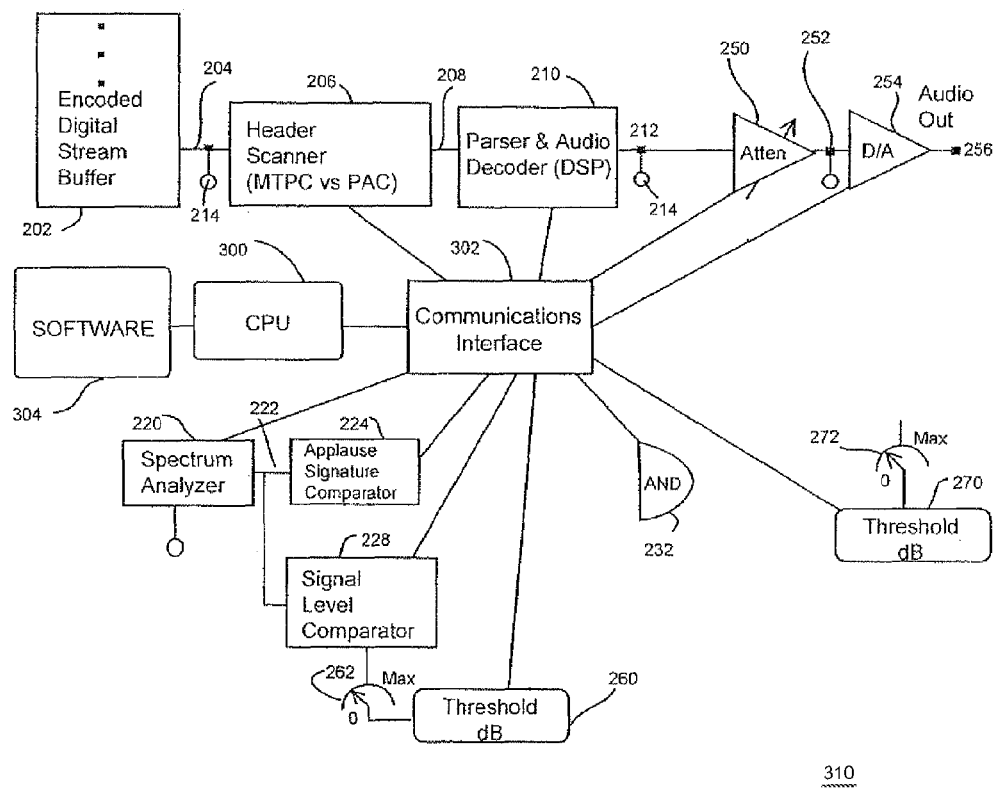
FIG. 3 is a diagram of an embodiment of the system in which components of the system comprise separate devices or comprise an integrated device suitable for semiconductor manufacturing.

The FIG. 3 discloses a distributed processing based system 310 having a CPU 300 sending and receiving commands (signals) via a link to a communications interface 302. The CPU based system uses applications software 304 stored in the CPU memory that determines the order and type of commands directed via the communications interface 302. Each of the elements 202, 206, 210, 250, 254, 220, 224, 232, 272, 270, 228, 262 and 260 are linked to one another and to the CPU through the communications interface 302. Commands (signals) are sent and received by the elements via the communications interface 302. The implementation of FIG. 3 allows for a system to be constructed using discrete hardware and processing blocks operated according to applications software possessing various communications protocols and interconnection protocols including but not limited to GPIB, USB, IEEE 1394, UART, 12C and 12S. Such blocks can be stand-alone discrete units comprising, test equipment, logic gates or unit processors such as computers.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Patents, patent applications and publications where referred to herein are hereby incorporated by reference in their entireties. Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising the steps of:
   receiving and playing a satellite radio signal with a play volume;
   automatically detecting whether the satellite radio signal contains data representing applause,
   wherein the detecting step includes:
      comparing the spectral signature of the satellite radio signal to a predetermined spectral signature of applause; and
      calculating a variance of the spectral signatures and comparing the variance to a threshold value; and
   automatically attenuating the play volume while the satellite radio signal contains data representing applause.

2. The method of claim 1, further comprising restoring the play volume to a normal level thereof when the satellite radio signal no longer contains data representing applause.

3. The method of claim 1, further comprising:
   determining whether the satellite radio signal has a first radio signal type or a second radio signal type;
   performing the detecting and attenuating steps if the satellite radio signal has the first radio signal type; and
   omitting the detecting and attenuating steps if the satellite radio signal has the second radio signal type.

4. The method of claim 3, wherein the first radio signal type is a signal type produced by multimode transform predictive coder encoding, and the second radio signal type is a signal type produced by perceptual audio encoding.

5. The method of claim 3, wherein the first radio signal type has a lower bit rate and lower audio quality compared to the second radio signal type.

6. The method of claim 1, wherein the spectral signature of the satellite radio signal is obtained by applying an algorithm including, but not limited to a classification algorithm, a features definition algorithm or a genetic algorithm.

7. The method of claim 1, further comprising disabling attenuation of the play volume while the satellite radio signal is determined to not contain data representing applause.

8. Satellite radio apparatus comprising:
   a satellite radio receiver for receiving and demodulating a satellite radio signal to generate a demodulated signal comprising digitally represented sounds for listening;
   a processor, the processor automatically detecting whether the digitally represented sounds contain applause, and the processor automatically attenuating the gain of digitally represented sounds containing applause; and
   a header scanner adapted to determine whether the demodulated signal is of a first type or a second type, wherein the automatic detecting and attenuating of the processor is disabled if the demodulated signal is of the second type.

9. The apparatus of claim 8, wherein the processor includes:
   means for obtaining a spectral signature of the digitally represented sounds, and
   means for applying a predetermined criterion to the spectral signature.

10. The apparatus of claim 8, wherein the processor comprises:
a spectrum analyzer having an internal memory for obtaining a spectral signature of the digitally represented sounds;
a detector for automatically detecting whether the digitally represented sounds contain applause;
an attenuator for attenuating the digitally represented sounds containing applause; and
a digital to analog converter for converting the attenuated digitally represented sounds for audio listening.

11. The apparatus of claim 10, wherein the spectrum analyzer performs a mathematical algorithm on the digitally represented sounds, wherein the mathematical algorithm includes, but is not limited to a classification algorithm, a features definition algorithm or a genetic algorithm.

12. The apparatus of claim 10, wherein the processor is disconnectable from the satellite radio receiver.

13. The apparatus of claim 10, wherein the spectrum analyzer is provided with an input terminal for updates.

14. The apparatus of claim 10, comprising:
a threshold dB setting in a memory block; and
a comparator comparing the radio signal to the threshold dB setting and disabling the attenuator when applause in the radio signal abates to the level of the threshold dB.

15. The apparatus of claim 14, wherein the threshold dB setting is adjustable.

16. The apparatus of claim 10, wherein the detector is adapted to:
compare the spectral signature of the digitally represented sounds to a predetermined spectral signature of applause;
calculate a variance of the spectral signatures; and
compare the variance to a threshold value.

17. Satellite radio apparatus comprising:
a satellite radio receiver for receiving and demodulating a satellite radio signal to generate a demodulated signal comprising digitally represented sounds for listening; and
a processor, the processor automatically detecting whether the digitally represented sounds contain applause, and the processor automatically attenuating the gain of digitally represented sounds containing applause, wherein:
the processor comprises:
a spectrum analyzer having an internal memory for obtaining a spectral signature of the digitally represented sounds;
a detector for automatically detecting whether the digitally represented sounds contain applause;
an attenuator for attenuating the digitally represented sounds containing applause; and
a digital to analog converter for converting the attenuated digitally represented sounds for audio listening; and
the detector is adapted to:
compare the spectral signature of the digitally represented sounds to a predetermined spectral signature of applause;
calculate a variance of the spectral signatures; and
compare the variance to a threshold value.

18. A method comprising the steps of:
receiving and playing a satellite radio signal with a play volume;
automatically detecting whether the satellite radio signal contains data representing applause;
automatically attenuating the play volume while the satellite radio signal contains data representing applause;
determining whether the satellite radio signal has a first radio signal type or a second radio signal type, wherein the first radio signal type is a signal type produced by multimode transform predictive coder encoding, and the second radio signal type is a signal type produced by perceptual audio encoding;
performing the detecting and attenuating steps if the satellite radio signal has the first radio signal type; and
omitting the detecting and attenuating steps if the satellite radio signal has the second radio signal type.

19. A method comprising the steps of:
receiving and playing a satellite radio signal with a play volume;
automatically detecting whether the satellite radio signal contains data representing applause;
automatically attenuating the play volume while the satellite radio signal contains data representing applause;
determining whether the satellite radio signal has a first radio signal type or a second radio signal type, wherein the first radio signal type has a lower bit rate and lower audio quality compared to the second radio signal type;
performing the detecting and attenuating steps if the satellite radio signal has the first radio signal type; and
omitting the detecting and attenuating steps if the satellite radio signal has the second radio signal type.

20. The method of claim 19, further comprising restoring the play volume to a normal level thereof when the satellite radio signal no longer contains data representing applause.

* * * * *